United States Patent [19]
Ishii et al.

[11] Patent Number: 5,236,295
[45] Date of Patent: Aug. 17, 1993

[54] ARM APPARATUS FOR CONVEYING SEMICONDUCTOR WAFER AND PROCESSING SYSTEM USING SAME

[75] Inventors: Katsumi Ishii, Fujino; Yoshinori Mochizuki, Hachioji, both of Japan

[73] Assignee: Tokyo Electron Sagami Limited, Kanagawa, Japan

[21] Appl. No.: 872,106

[22] Filed: Apr. 22, 1992

Related U.S. Application Data

[62] Division of Ser. No. 538,425, Jun. 15, 1990, Pat. No. 5,123,804.

[51] Int. Cl.$^5$ .............................................. B65H 5/00
[52] U.S. Cl. .................................... 414/222; 414/680; 414/744.6; 901/30; 901/8
[58] Field of Search ............... 414/783, 763, 680, 729, 414/751, 744.8, 222, 225, 744.6; 901/30, 40, 8; 294/8, 53.5, 67.1, 68.26, 32

[56] References Cited

U.S. PATENT DOCUMENTS

| | | | |
|---|---|---|---|
| 3,675,962 | 7/1972 | Simpson | 294/902 X |
| 3,834,213 | 9/1974 | Henzler et al. | 414/225 X |
| 4,095,832 | 6/1978 | Slinker | 294/8 |
| 4,416,577 | 11/1983 | Inaba et al. | 901/30 X |
| 4,648,786 | 3/1987 | Sakurai | 901/40 X |
| 4,938,691 | 7/1990 | Ohkase et al. | 414/152 X |
| 4,955,775 | 9/1990 | Ohkase et al. | 452/239 X |

FOREIGN PATENT DOCUMENTS

| | | | |
|---|---|---|---|
| 115884 | 10/1941 | Austria | 294/8 |
| 63330921 | 7/1990 | Japan | |

Primary Examiner—Michael S. Huppert
Assistant Examiner—Donald W. Underwood
Attorney, Agent, or Firm—Oblon, Spivak, McClelland, Maier & Neustadt

[57] ABSTRACT

A wafer boat has an upper projection, a lower projection, and a lower flange. A horizontal/vertical conversion handling apparatus for handling the wafer boat comprises a rotatable arm, and upper and lower hands provided at both ends of the arm. The arm is rotatable by at least 90° in a vertical plane. The upper hand has boat contact portions for contact in horizontal and vertical modes, which are engaged with the upper projection on both sides thereof. The boat contact portions of the upper hand are vertically arranged such that the positions of the boat contact portions are reversed by the 180° rotation of the upper hand. The lower hand has boat contact portions for contact in a horizontal mode, which are engaged with the lower projection on both sides thereof, and boat contact portions for contact in a vertical mode, which are engaged with the lower surface of the lower flange. The boat contact portions of the lower hand are vertically arranged, such that the positions of both the boat contact portions for contact in the horizontal mode and the boat contact portions for contact in the vertical mode are reversed by the 180° rotation of the lower hand. The positions of the boat contact portions ar changed according to the steps to be performed, thereby preventing cross-contamination.

16 Claims, 5 Drawing Sheets

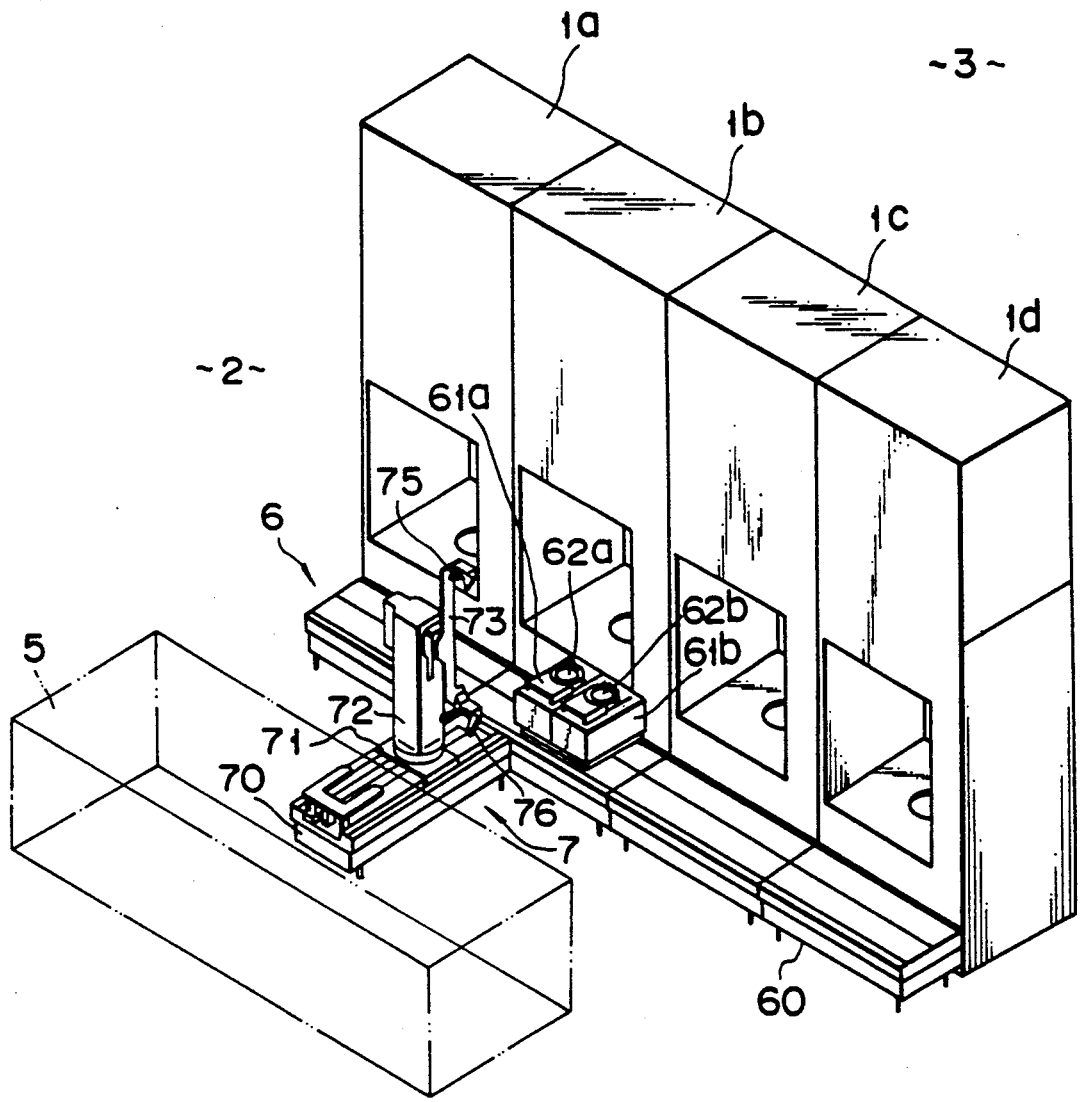
F I G. 1

ARM APPARATUS FOR CONVEYING SEMICONDUCTOR WAFER AND PROCESSING SYSTEM USING SAME

This is a division of application Ser. No. 07/538,425 filed on Jun. 15, 1990, now U.S. Pat. No. 5,123,804.

BACKGROUND OF THE INVENTION

1. Field of the Invention

The present invention relates to a handling method and a handling apparatus.

2. Description of the Related Art

With the recent development of semiconductor devices having a higher degree of integration, circuit patterns have been decreasing in size more and more. In producing such fine circuit patterns, the presence of dust poses a serious problem. Thus, in the manufacture of semiconductor devices, a great effort has been made to reduce dust in atmosphere.

Under the situation, the number of workers, which is closely related to the amount of dust, has been reduced as much as possible in the manufacture of semiconductor devices in a clean room. For example, handling apparatuses, to which robot techniques have been applied, are widely employed in handling semiconductor wafers, wafer boats, liquid-crystal display substrates, etc. In such handling apparatuses, for example, two hold arms provided with vacuum chucks hold semiconductor wafers, or two hold hands arranged with a distance hold both ends of a quartz wafer boat.

According to the study conducted by the inventors, serious problems occur in handling apparatuses which handle objects, such as semiconductor wafers, wafer boats, or liquid-crystal display substrates, in different steps, e.g. a CVD film forming step and a oxide film forming step, or a resist coating step and a developing step. Namely, a chemical or a product adheres to that part of the hold arm or hold hand which is put in contact with a object in a certain step. Then, the chemical or the product adheres to another object and contaminates the atmosphere of another step ("cross-contamination").

SUMMARY OF THE INVENTION

The present invention has been made in consideration of the above circumstances, and its object is to provide a handling method and a handling apparatus capable of preventing cross-contamination in different steps.

According to the handling method of this invention, those portions of a support mechanism for supporting and conveying objects to subject the objects to different treatment steps, which are brought into contact with the objects, are changed in accordance with the treatment steps.

This method is applicable to a horizontal/vertical handling apparatus for handling a wafer boat, a boat liner for a wafer boat, a convey arm for a wafer, etc.

The handling apparatus of this invention is a horizontal/vertical conversion handling apparatus for handling a wafer boat, comprising: arm means rotatable by at least 90° in a substantially vertical plane; upper hand means provided at one end of said arm means, said upper hand means having a plurality of boat contact portions which are put in contact with a boat both in horizontal and vertical modes, and said upper hand means being able to change the positions of said boat contact portions; and lower hand means provided at the other end of said arm means, said lower hand means having a plurality of boat contact portions for contacting the boat in a horizontal mode and a plurality of boat contact portions for contacting the boat in a vertical mode, and said lower hand means being able to change the positions of both said boat contact portions for contacting the boat in the horizontal mode and in the vertical mode.

According to this invention, in the step of handling the object, at least those portions of the support mechanism for supporting the object, which are put into contact with the object, are changed. Thus, cross-contamination of atmospheres between different steps by chemicals or products, which are due to the contact with the objects, can be prevented.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a perspective view showing a vertical heat treatment apparatus, in relation to which a handling method and a handling apparatus according to an embodiment of the present invention will be described;

DETAILED DESCRIPTION OF THE PREFERRED EMBODIMENTS

Embodiments of the present invention will now be described with reference to the accompanying drawings.

FIG. 1 is a perspective view showing a vertical heat treatment apparatus, in relation to which a handling method and a handling apparatus according to an embodiment of the present invention will be described. In each of casings 1a to 1d, a reaction furnace (not shown)

is vertically provided, which comprises a cylindrical reaction tube made of, e.g. quartz, a heater surrounding the reaction tube, a soaking tube, and a heat insulator. Under each reaction furnace, there is provided a boat elevator for loading/unloading objects, e.g. semiconductor wafers arranged on wafer boats, in/from the reaction furnace. The four casings 1a to 1d (the number of casings can be freely chosen) are aligned along the boundary between a clean room 2 and a maintenance room 3.

Figure 2:
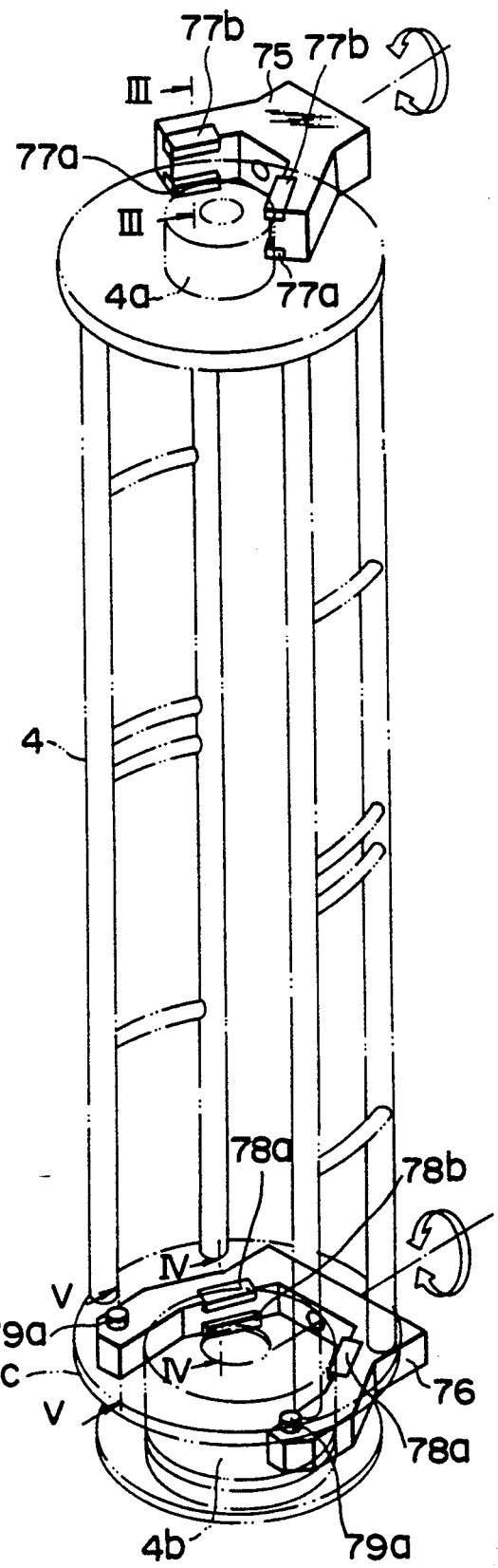
FIG. 2 is a perspective view showing an important part of a horizontal/vertical conversion type handling apparatus shown in FIG. 1.

In front of the casings 1a to 1d (i.e. within the clean room 2) there are provided a shifter 5 for shifting semiconductor wafers from a wafer cassette onto a wafer boat 4 as shown in FIG. 2, a boat liner 6 serving as a convey mechanism for conveying the wafer boat 4 to the fronts of the casings 1a to 1d, and a horizontal/vertical conversion handling mechanism 7 serving as a mechanism for conveying the wafer boat 4 from the shifter 5 and placing the wafer boat 4 on the boat liner 6 almost vertically.

As is well known, the shifter 5 shifts the semiconductor wafers in units of, e.g. 25, from the wafer cassette onto the wafer boat 4 which is vertically arranged, and also stores the processed semiconductor wafers from the boat 4 into the wafer cassette.

The boat liner 6 comprises a convey path 60 extending in front of, and in parallel with, the aligned casings 1a to 1d, and a plurality (e.g. two) of boat support mechanisms 61a and 61b which can be moved on the convey path 60 by means of belt drive and can hold the wafer boat almost vertically. The support mechanisms 61a and 61b for holding the wafer boat 4 are switched in accordance with the step to be carried out, e.g. a CVD step or an oxide film forming step.

The handling apparatus 7 includes a base 70 bridging the shifter 5 and the boat liner 6. A movable table 71 and a support column 72 are arranged on the base 70, such that the movable table 71 and the column 72 are movable between the shifter 5 and the boat liner 6. The column 72 is rotatable by 180° or more in a horizontal plane on the movable table 71. A conversion arm 73 is attached to the side surface of the support column 72. The arm 73 is vertically movable and is rotatable by about 90° or more in an imaginary plane extending substantially in parallel to the side surface of the column 72. As is shown in FIG. 2 in detail, both ends of the conversion arm 73 are provided with an upper boat hand 75 and a lower boat hand 76 for holding the wafer boat 4. The upper and lower boat hands 75 and 76 are designed to be able to hold the wafer boat 4 both in the substantially horizontal state and in the substantially vertical state. The upper and lower boat hands 75 and 76 will now be described in greater detail.

Figure 3:
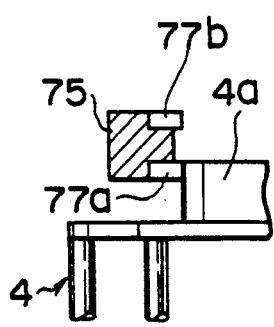
FIG. 3 is a cross-sectional view taken along line III—III in FIG. 2.

As is shown in FIG. 3, both facing inner surfaces of the upper boat hand 75 have engaging portions 77a and 77b which are made of quartz, silicon carbide, etc. and are projected slightly from the facing inner surfaces. Either the engaging portions 77a or the engaging portions 77b hold the side surface of an upper cylindrical support portion 4a formed on the upper end of the wafer boat 4. Namely, either the engaging portions 77a or the engaging portions 77b, which are to be brought into contact with the wafer boat 4, are selected by rotating the upper boat hand 75 in the direction indicated by an arrow in FIG. 2, depending on the step to be carried out (e.g. a CVD step, an oxide film formation step, etc.).

Figure 4:
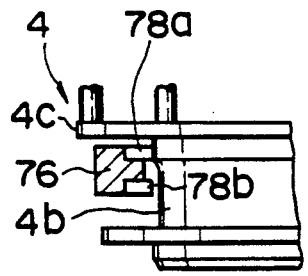
FIG. 4 is a cross-sectional view taken along line IV—IV in FIG. 2.

As is shown in FIG. 4, like the upper boat hand 75, both facing inner surfaces of the lower boat hand 76 have engaging portions 78a and 78b which are made of quartz, silicon carbide, etc. and are projected slightly from the facing inner surfaces. Either the engaging portions 78a or the engaging portions 78b hold the side surface of a lower cylindrical support portion 4b formed on the lower end of the wafer boat 4. The upper part of the lower support portion 4b of the wafer boat 4, which is brought into contact with a selected pair of the engaging portions 78a or the engaging portions 78b, has a greater diameter than the lower part of the support portion 4b, so that the lower part of the support portion 4b does not contact the non-selected pair of the engaging portions 78a or the engaging portions 78b.

Figure 5:
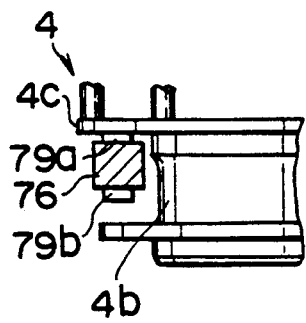
FIG. 5 is a cross-sectional view taken along line V—V in FIG. 2.

As is shown in FIG. 5, the distal end portions of the lower boat hand 76 are provided with flange engaging portions 79a and 79b which project vertically. A selected pair of the portions 79a or portions 79b support the lower surface of a flange 4c of wafer boat 4, when the wafer boat 4 is situated vertically. The flange engaging portions 79a and 79b are made of quartz, silicon carbide, etc. Like the upper boat hand 75, the lower boat hand 76 is rotated in the direction indicated by an arrow in FIG. 2, whereby either the flange engaging portions 79a and engaging portions 78a, or the flange engaging portions 79b and engaging portions 78b, which are to be put in contact with the wafer boat 4, are selected, according to the step to be carried out (e.g. a CVD step, an oxide film formation step, etc.).

More specifically, when the wafer boat 4 is held almost horizontally, either the engaging portions 77a or the engaging portions 77b of the upper boat hand 75 hold the side surface of the upper support portion 4a of wafer boat 4, and either the engaging portions 78a or the engaging portions 78b of the lower boat hand 76 hold the side surface of the lower support portion 4b of wafer boat 4.

On the other hand, when the wafer boat 4 is held almost vertically, either the engaging portions 77a or the engaging portions 77b of the upper boat hand 75 hold the side surface of the upper support portion 4a of wafer boat 4, and either the flange engaging portions 79a or the flange engaging portions 79b of the lower boat hand 76 support the lower surface of the flange portion 4c of wafer boat 4. In this case, the flange engaging portions 79a (79b) are offset to the front side with respect to the longitudinal axis of the wafer boat 4. Thus, an angular moment acts upon the wafer boat 4 on the engaging portions 79a (79b) to incline the wafer boat 4 rearwards. The angular moment, however, is received by the engaging portions 77a (77b) of the upper boat hand 75 which hold the side surface of the upper support portion 4a. As a result, the wafer boat 4 can be vertically held with stability.

Figure 6:
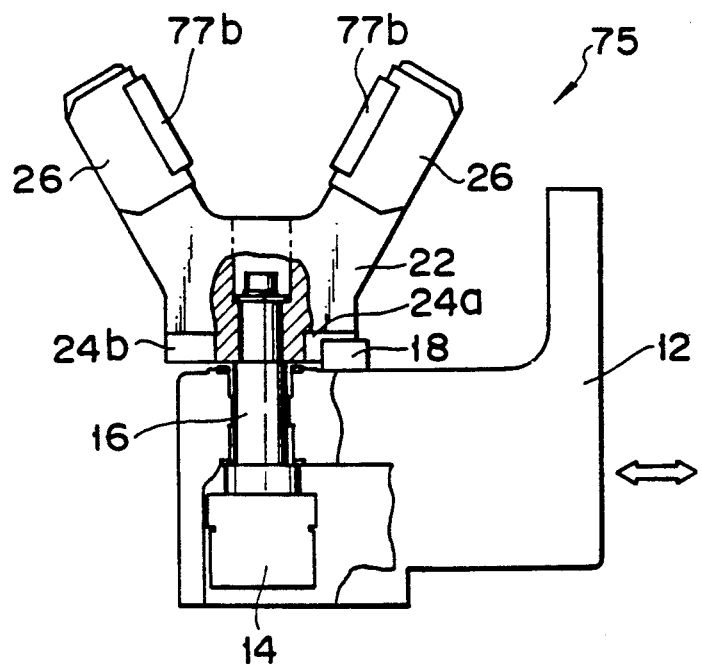
FIG. 6 is a partially broken plan view of an upper boat hand.

FIG. 6 is a partially broken plan view of the upper boat hand 75. The hand 75 includes a base portion 12 attached to the conversion arm 73 (see FIG. 1) with a little play in the direction indicated by an arrow in FIG. 6. A rotary actuator 14 is contained in the base portion 12. A shaft 16 connected to the output shaft of the actuator 14 extends from the base portion 12 and is connected to a hand body 22. The engaging portions 77a and 77b are attached to the hand body 22 with holders 26 interposed therebetween.

The hand body 22 is rotatable in both directions, relative to the base portion 12, by virtue of the function of the actuator 14. Recesses 24a and 24b are formed at both sides of a proximal end portion of the hand body 22. The base portion 12 has a stopper 18 designed to abut against the recesses 24a and 24b. When the hand body 22 rotates relative to the base portion 12 and the recess 24a abuts against the stopper 18 (the state shown in FIGS. 2 and 6), the engaging portions 77a take a lower position than the engaging portions 77b and face the upper support portion 4a of the wafer boat 4. Then, when the hand body 22 is rotated reversely by 180° and the recess 24b abuts against the stopper 18, the engaging portions 77b take a lower position and face the upper support portion 4a of wafer boat 4.

Figure 7:
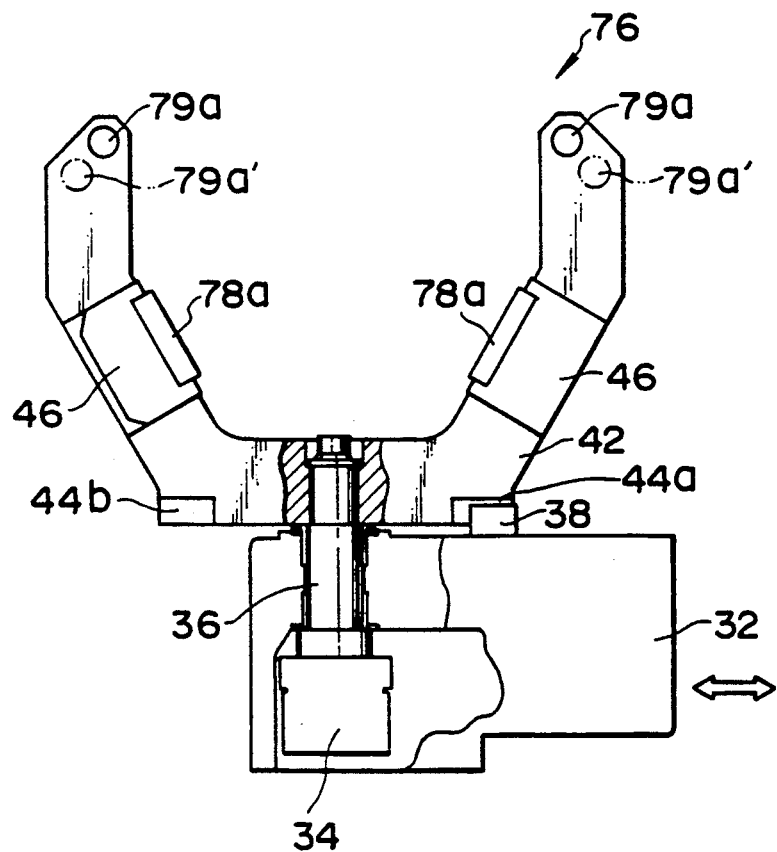
FIG. 7 is a partially broken plan view of a lower boat hand.

FIG. 7 is a partially broken plan view of the lower boat hand 76. The hand 76 includes a base portion 32 attached to the conversion arm 73 (see FIG. 1) with a little play in the direction indicated by an arrow in FIG. 7. A rotary actuator 34 is contained in the base portion 32. A shaft 36 connected to the output shaft of the actuator 34 extends from the base portion 32 and is connected to the hand body 42. The engaging portions 78a and 78b are attached to the hand body 42 with holders 46 interposed therebetween. The flange engaging portions 79a and 79b are attached to the upper and lower surfaces of the distal end portions of the hand body 42. If necessary, there may be provided second flange engaging portions 79a' on the upper surface (and similar ones on the lower surface).

The hand body 42 is rotatable in both directions, relative to the base portion 32, by virtue of the function of the actuator 34. Recesses 44a and 44b are formed at both sides of a proximal end portion of the hand body 42. The base portion 32 has a stopper 38 designed to abut against the recesses 44a and 44b. When the hand body 42 rotates relative to the base portion 32 and the recess 44a abuts against the stopper 38 (the state shown in FIGS. 2 and 7), the engaging portions 78a take an upper position than the engaging portions 78b and face the large-diameter part of the lower support portion 4b of the wafer boat 4, and also the flange engaging portions 79a take an upper position to support the flange portion 4c of wafer boat 4. Then, when the hand body 42 is rotated reversely by 180° and the recess 44b abuts against the stopper 38, the engaging portions 78b take an upper position and face the large-diameter part of the lower support portion 4b of wafer boat 4, and also the flange engaging portions 79b take an upper position to support the flange portion 4c of wafer boat 4.

According to the above embodiment, semiconductor wafers stored in the wafer cassette are shifted onto the wafer boat 4 by the shifter 5. In this case, the arm 73 of the horizontal/vertical conversion handling apparatus 7 is inserted under the wafer boat 4 located at a predetermined position on the shifter 5, and the handling apparatus 7 stands by in this state. When the shift of the semiconductor wafers by the shifter 5 is completed, the conversion arm 73 is raised and the apparatus 7 takes the wafer boat 4 from the shifter 5. Thereafter, the movable table 71 is moved to convey the wafer boat 4 towards the boat liner 6 up to a position where the wafer boat 4 does not interfere with the shifter 5. Then, the wafer boat 4 is rotated by 90° in a vertical plane, and it is held almost vertically. Subsequently, the support column 72 is rotated by about 180° in a horizontal plane, so that the wafer boat 4 faces the boat liner 6. The movable table 71 is moved further towards the boat liner 6, and the wafer boat 4 is placed onto the boat support mechanism 61a or 61b. Annular boat support portions 62a and 62b are formed on the support mechanisms 61a and 61b. The lower end portion of the wafer boat 4 is put in the boat support portion 62a (62b).

After the wafer boat 4 is moved from the horizontal position to the vertical position and is transferred from shifter 5 to the boat liner 6, the wafer boat 4 is conveyed by the boat liner 6 to the front of any one of the casings 1a to 1d. Then, the wafer boat 4 is placed into the reaction furnace by means of the boat elevator (not shown). In the furnace, the semiconductor wafers on wafer boat 4 are subjected to processing, such as heat diffusion, oxide film formation, CVD, etc. Upon the completion of the processing, the wafer boat 4 is conveyed to the shifter 5 in the manner reverse to that stated above. The processed semiconductor wafers are stored in the wafer cassette by the shifter 5.

Suppose that two types of processing are simultaneously performed in the four reaction furnaces. For example, a CVD step is carried out in the reaction furnaces in the casings 1a and 1b, and an oxide film formation step is carried out in the reaction furnaces in the casings 1c and 1d. In this case, the wafer boat 4 is conveyed to the casings 1a and 1b (the CVD step) by the support mechanism 61a of the boat liner 6, and the wafer boat 4 is conveyed to the casings 1c and 1d (the oxide film formation step) by the support mechanism 61b. Thus, the cross-contamination between the steps can be prevented. In addition, with respect to the horizontal/vertical handling apparatus 7, the upper boat hand 75 and the lower boat hand 76 are rotated, whereby the wafer boat 4 to be subjected to the CVD step in the casing 1a (1b) is supported by the engaging portions 77a, the engaging portions 78a, and the flange engaging portions 79a, and the wafer boat 4 to be subjected to the oxide film formation step in the casing 1c (1d) is supported by the engaging portions 77b, the engaging portions 78b, and the flange engaging portions 79b. In this way, the portions to be put in contact with the wafer boat 4 are changed according to the step, thereby preventing cross-contamination.

In other words, according to the above embodiment, those portions of the boat liner 6 and the horizontal/vertical conversion handling apparatus 7, which contact the wafer boat 4, are changed between the case where the semiconductor wafers in wafer boat 4 are subjected to the CVD step and the case where the semiconductor wafers in wafer boat 4 are subjected to oxide film formation step. Thus, the cross-contamination between the steps by chemicals or products, which adhere to the portions contacting the wafer boat 4, can be prevented.

Figure 8:
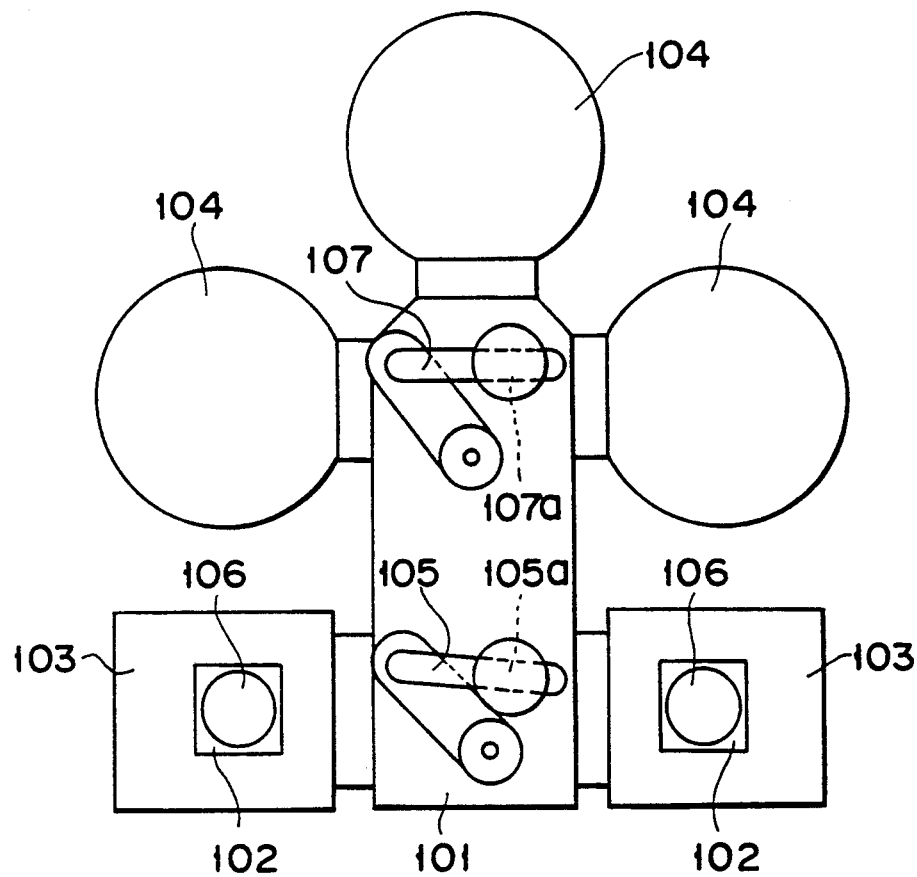
FIG. 8 is a diagram showing the structure of a multi-chamber type CVD (chemical vapor deposition) apparatus, in relation to which another embodiment of the invention will be described.
Figure 9:
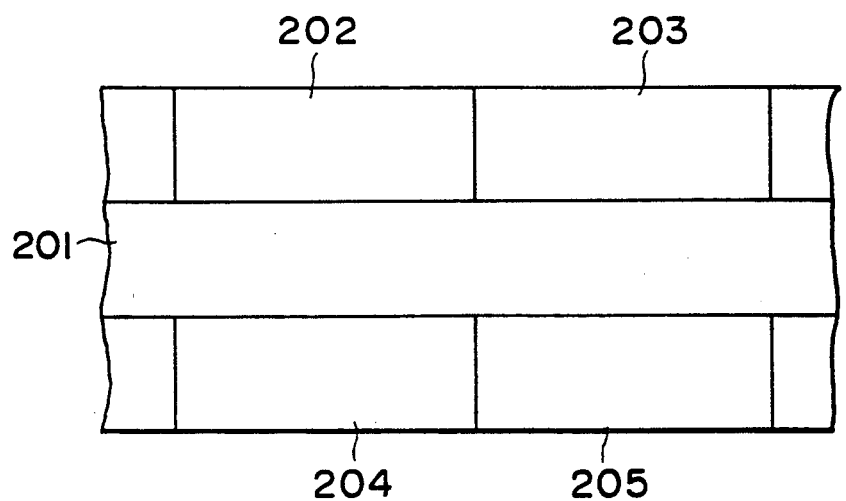
FIG. 9 is a diagram showing the structure of a resist treatment apparatus, in relation to which still another embodiment of the invention will be described.

In the above embodiment, the method and apparatus of the present invention have been applied to a multiple vertical heat treatment apparatus; however, this invention is also applicable to a multi-chamber CVD apparatus, as shown in FIG. 8, or to a resist treatment apparatus, as shown in FIG. 9.

As is shown in FIG. 8, the multi-chamber CVD apparatus has a wafer convey chamber 101 at its central part. One end portion of the wafer convey chamber 101 is interposed between load lock chambers 103 for storing wafer cassettes 102, and the other end portion of the wafer convey chamber 101 is surrounded by a plurality of (e.g. three) chambers 104. A given semiconductor wafer 106 is taken out by a convey arm 105, and is then transferred to another convey arm 107 on the chamber (104) side. The semiconductor wafer 106 is conveyed to one of chambers 104 in accordance with the step of treatment to be carried out. For example, a natural oxide film on the surface of the semiconductor wafer is etched in the first chamber, and then a CVD film is formed in the second chamber, following which the wafer is subjected to heat treatment in the third chamber.

It is possible to form a distal end portion of each of the convey arms 105 and 107 in a plate-like shape, such that both side surfaces of the distal end portion can support the semiconductor wafer 106. In accordance with the step to be performed, contact portions 105a and 107a of arms 105 and 107 are rotated by 180°. Alternatively, a second contact portion for supporting the semiconductor wafer 106, which is extendible/retreatable, is provided at the end portion of each of the convey arms 105 and 107. In accordance with the step to be performed, the second contact portion is extended/retreated to support the semiconductor wafer 106. As in the above-described embodiment, the cross-contamination can be prevented by reversing the contact portions 105a and 107a contacting the semiconductor wafer 106, or by employing the second contact portions, in accordance with the step to be performed.

Figure 10:
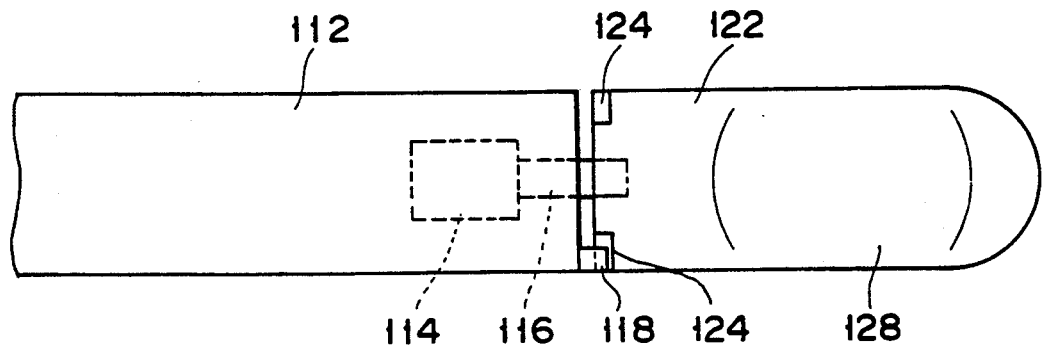
FIGS. 10 and 11 are plan views schematically showing modifications of a transfer arm.

FIG. 10 is a schematic plan view showing an example of the convey arm, wherein the distal end portion of the convey arm is rotated by 180° to change the contact portion. This convey arm comprises a base portion 112 and a distal-end plate 122. A rotary cylinder 114 is contained in the base portion 112. A shaft 116 of the rotary cylinder 114 extends from the base portion 112, and is connected to the distal-end plate 122. Wafer contact portions 128 are formed on both sides of the plate 122.

The distal-end plate 122 is rotatable in both directions, relative to the base portion 112, by virtue of the function of the cylinder 114. Recesses 124 are formed at both sides of a proximal end portion of the plate 122. The base portion 112 has a stopper 118 which abuts against either recess 124. As in the mechanism shown in FIGS. 6 and 7, the distal-end plate 122 is rotated by 180° relative to the base portion 112, and the stopper 118 abuts against either recess 124. Thus, the position of the plate 122 is fixed, and the wafer contact portion 128 is selected.

The switching operation of contact portions of a convey arm can be performed by a linear movement rather than the rotary movement.

Figure 11:
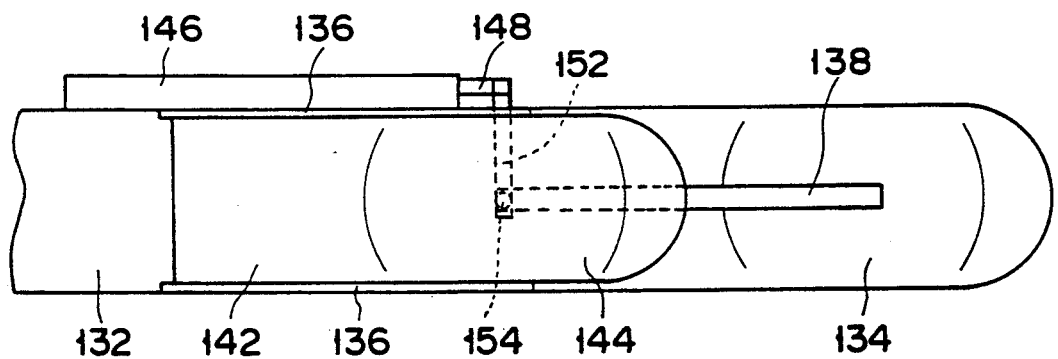

FIG. 11 is a schematic plan view showing an example of the convey arm, wherein an extendible/retreatable second contact portion is provided near the distal end of the arm, thereby changing the wafer contact portion. This convey arm has an arm body 132. A wafer contact portion 134 is formed at the distal end of the arm body 132. A second wafer contact portion 144 is formed on a slide plate 142 supported on the arm body 132. A reciprocal cylinder 146 is arranged on one side of the arm body 132. A cylinder rod 148 is connected to the bottom surface of the slide plate 144 via a bar 152 and a pin 154.

The slide plate 142 is moved along the longitudinal axis of the arm body 132 upon the operation of the cylinder 146. In this case, both side portions of the slide plate 142 are guided by guides 136 provided on both sides of the arm body 132. The pin 154 is guided along a slit 138 cut along the longitudinal axis of the body 132. The wafer contact portions 134 and 144 are switched by extending/retreating the slide plate 144.

A resist treatment apparatus shown in FIG. 9 has a convey device 201 at its central part. Along the convey device 201, there are provided a resist-coating device 202, a plurality of baking devices 203, an exposing device 204, and a developing device 205. In the resist-coating device 202, a resist drop is put on a semiconductor wafer, and the wafer is rotated at high speed, thus uniformly coating a resist film over the wafer. The baking devices 203 bake the semiconductor wafer, for example, before and after the coating of the resist.

According to this resist treatment apparatus, like the multi-chamber CVD apparatus, the convey arm as shown in FIG. 10 or FIG. 11 is employed as the arm of the convey device 201. By changing the wafer contact portion according to the step to be performed, the cross-contamination can be prevented.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An arm apparatus for conveying a semiconductor wafer, comprising;
   an arm base;
   a distal-end plate having opposite outer sides and rotatably connected to an end of the arm base so as to be invertible between both sides thereof;
   first and second mount regions respectively formed on the opposite outer sides of the distal-end plate and shaped so as to support the wafer;
   horizontally driving means for moving the arm base and the distal-end plate integrally in a horizontal plane; and
   an actuator for rotating the distal-end plate relative to the arm base, the actuator being supported by the arm base;
   wherein the distal-end plate is inverted so as to position one of the first and second mount regions in a wafer-supporting position facing upward.

2. The apparatus according to claim 1, wherein the horizontally driving means includes an arm element which supports the arm base pivotally in a horizontal plane.

3. The apparatus according to claim 1, wherein the distal-end plate has dimensions permitting the water to be taken out from a container in which the wafer is stored.

4. The apparatus according to claim 1, wherein the actuator comprises a bidirectional rotary actuator located on the arm base, and first and second engaging means are respectively provided on the arm base and the distal-end plate, so as to be engaged with each other and stop one of the first and second mount regions at the wafer-supporting position.

5. The apparatus according to claim 4, wherein the first engaging means comprises a stopper protruding from one of the arm base and the distal-end plate, and the second engaging means comprises means to be in contact with the stopper provided to the other of the arm base and the distal-end plate.

6. The apparatus according to claim 5, wherein the means to be in contact with the stopper comprises two recesses formed one on either side of the other of the arm base and the distal-end plate.

7. The apparatus according to claim 6, wherein the stopper is provided to the arm base and the recesses are provided to the distal-end plate.

8. A processing system for processing a semiconductor wafer, comprising:

(a) a plurality of process chambers which house the wafer and subject it to respective processes different from each other; and (b) an arm apparatus for transferring the wafer into and from the process chambers, and comprising:

an arm base, a distal-end plate having opposite outer sides and rotatably connected to an and of the arm base so as to be invertible between both sides thereof, first and second mount regions respectively formed on the opposite outer sides of the distal-end plate and shaped so as to support the wafer, horizontally driving means for moving the arm base and the distal-end plate integrally in a horizontal plane, and an actuator for rotating the distal-end plate relative to the arm base, the actuator being supported by the arm base, wherein the distal-and plate is inverted so as to position one of the first and second mount regions in a wafer-supporting position facing upward.

9. The system according to claim 8, wherein the horizontally driving means includes an arm element which supports the arm base pivotally in a horizontal plane.

10. The system according to claim 8, wherein the distal-end plate has dimensions permitting the wafer to be taken out from a container in which the wafer is stored.

11. The system according to claim 8, wherein the actuator comprises a bidirectional rotary actuator located on the arm base, and first and second engaging means are respectively provided on the arm base and the distal-end plate, so as to be engaged with each other and stop one of the first and second mount regions at the wafer-supporting position.

12. The system according to claim 11, wherein the first engaging means comprises a stopper protruding from one of the arm base and the distal-and plate, and the second engaging means comprises means to be in contact with the stopper provided to the other of the arm base and the distal-end plate.

13. The system according to claim 12, wherein the means to be in contact with the stopper comprises two recesses formed one on either side of the other of the arm base and the distal-end plate.

14. The system according to claim 13, wherein the stopper is provided to the arm base and the recesses are provided to the distal-end plate.

15. The system according to claim 11, wherein each of the process chambers includes means for performing a process selected from a group consisting of etching of natural oxide film, CVD, and heat treatment.

16. A processing system for processing a semiconductor wafer, comprising:

(a) a plurality of process chambers which house the wafer and subject it to respective processes different from each other;

(b) a first arm apparatus for transferring the wafer into and from the process chambers, and comprising an arm base, a distal-end plate having opposite outer sides and rotatably connected to an end of the arm base so as to be invertible between both sides thereof.

first and second mount regions respectively formed on the opposite outer sides of the distal-end plate and shaped so as to support the wafer, horizontally driving means for moving the arm base and the distal-end plate integrally in a horizontal plane, and including an arm element which supports the arm base pivotally in a horizontal plane, and an actuator for rotating the distal-end plate relative to the arm base, the actuator being supported by the arm base, wherein the distal-end plate is inverted so as to position one of the first and second mount regions in a wafer-supporting position facing upward;

(c) a wafer convey chamber connected to the process chambers, the first arm apparatus being arranged in the wafer convey chamber;

(d) a load lock chamber connected to the wafer convey chamber;

(e) a container for storing the wafer and positioned in the load lock chamber; and (f) a second arm apparatus for transferring the wafer into and from the container, the second arm apparatus being arranged in the wafer convey chamber and comprising an arm base, a distal-end plate having opposite outer sides and rotatably connected to an end of the arm base so as to be invertible between both sides thereof, first and second mount regions respectively formed on the opposite outer sides of the distal-end plate and shaped so as to support the wafer, horizontally driving means for moving the arm base and the distal-end plate integrally in a horizontal plane, and including an arm element which supports the arm base pivotally in a horizontal plane, and an actuator for rotating the distal-and plate relative to the arm base, the actuator being supported by the arm base, wherein the distal-end plate is inverted so as to position one of the first and second mount regions in a wafer-supporting position facing upward.

* * * * *